(12) United States Patent
Ghyselen

(10) Patent No.: US 7,348,260 B2
(45) Date of Patent: Mar. 25, 2008

(54) METHOD FOR FORMING A RELAXED OR PSEUDO-RELAXED USEFUL LAYER ON A SUBSTRATE

(75) Inventor: Bruno Ghyselen, Seyssinet-Pariset (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 48 days.

(21) Appl. No.: 11/181,414

(22) Filed: Jul. 13, 2005

(65) Prior Publication Data

US 2005/0250294 A1 Nov. 10, 2005

Related U.S. Application Data

(63) Continuation of application No. PCT/IB2004/000931, filed on Mar. 1, 2004, and a continuation-in-part of application No. 10/784,017, filed on Feb. 20, 2004, now abandoned.

(60) Provisional application No. 60/483,479, filed on Jun. 26, 2003.

(30) Foreign Application Priority Data

Feb. 28, 2003 (FR) .................................. 03 02519

(51) Int. Cl.
  *H01L 21/30* (2006.01)
  *H01L 21/46* (2006.01)
(52) U.S. Cl. ............... 438/458; 438/455; 257/E21.129; 257/E21.568; 257/E21.57
(58) Field of Classification Search ........ 257/E31.046, 257/55, 19; 438/110, 458
See application file for complete search history.

(56) References Cited

U.S. PATENT DOCUMENTS 5,461,243 A 10/1995 Ek et al. ..................... 257/190

(Continued)

FOREIGN PATENT DOCUMENTS

DE 101 00 194 A1 6/2001

(Continued)

OTHER PUBLICATIONS

T. Tezuka et al., XP001109835, High-Performance Strained Si-on-Insulator MOSFETs by Novel Fabrication Processes Ultilizing Ge-Condensation Technique, Symposium On VLSI Tech., Digest of Technical Papers. Honolulu, NY:IEEE US, pp. 96-97 (2002).

(Continued)

*Primary Examiner*—Michelle Estrada
*Assistant Examiner*—Jarrett J Stark
(74) *Attorney, Agent, or Firm*—Winston & Strawn LLP

(57) ABSTRACT

A method for forming a relaxed or pseudo-relaxed useful layer on a substrate is described. The method includes growing a strained semiconductor layer on a donor substrate, bonding a receiver substrate to the strained semiconductor layer by a vitreous layer of a material that becomes viscous above a certain viscosity temperature to form a first structure. The method further includes detaching the donor substrate from the first structure to form a second structure comprising the receiver substrate, the vitreous layer, and the strained layer, and then heat treating the second structure at a temperature and time sufficient to relax strains in the strained semiconductor layer and to form a relaxed or pseudo-relaxed useful layer on the receiver substrate.

26 Claims, 3 Drawing Sheets

U.S. PATENT DOCUMENTS

| | | | | |
|---|---|---|---|---|
| 5,882,987 | A | | 3/1999 | Sirikrishnan ................ 438/458 |
| 5,906,951 | A | | 5/1999 | Chu et al. .................... 438/751 |
| 6,352,942 | B1 | | 3/2002 | Luan et al. ................. 438/770 |
| 6,524,935 | B1 | * | 2/2003 | Canaperi et al. ............ 438/478 |
| 6,573,126 | B2 | | 6/2003 | Cheng et al. ............... 438/149 |
| 6,633,066 | B1 | | 10/2003 | Bae et al. .................... 257/347 |
| 6,717,213 | B2 | * | 4/2004 | Doyle et al. ................. 257/347 |
| 6,828,214 | B2 | * | 12/2004 | Notsu et al. ................. 438/455 |
| 6,953,736 | B2 | * | 10/2005 | Ghyselen et al. ........... 438/458 |
| 7,018,910 | B2 | * | 3/2006 | Ghyselen et al. ........... 438/458 |
| 7,067,386 | B2 | * | 6/2006 | Doyle et al. ................. 438/407 |
| 2002/0072130 | A1 | | 6/2002 | Cheng et al. ................. 438/10 |
| 2003/0003679 | A1 | | 1/2003 | Doyle et al. ................. 438/406 |
| 2003/0155568 | A1 | | 8/2003 | Cheng et al. ................. 257/12 |
| 2003/0168654 | A1 | | 9/2003 | Cheng et al. ................. 257/19 |
| 2004/0157409 | A1 | * | 8/2004 | Ghyselen et al. ........... 438/458 |

FOREIGN PATENT DOCUMENTS

| | | | |
|---|---|---|---|
| EP | 1 248 294 A2 | | 10/2002 |
| EP | 1443550 A1 | * | 8/2004 |
| FR | 2 818 010 | | 8/2002 |
| WO | WO 99/53539 | | 10/1999 |
| WO | WO 02/15244 A2 | | 2/2002 |
| WO | WO 02/47156 A1 | | 2/2002 |

OTHER PUBLICATIONS

S. Mantl et al., "Strain relaxation of epitaxial SGe layers on Si(100) improved by hydrogen implantation" Nuclear Instruments and Methods in Physics Research , vol. 147, No. 1-4, pp. 29-34 (1999).

B. Holländer et al., "Strain relaxation of pseudomorphic $Si_{1-x}Ge_x$/Si(100) heterostructures after hydrogen of helium ion implantation for virtual substrate fabrication", Nuclear Instruments and Methods in Physics Research B 175-177 (2001) 357-367 (2001).

K.D. Hobart et al. "Complaint Substrates: A Comparative Study of the Relaxation Mechanisms of Strained Films Bonded to High and Low Viscosity Oxides", Electronic Materials, vol. 29, No. 7 , pp. 897-900 (2000).

Friedrich Schäffler, "High-mobility Si and Ge structures", Semicond. Sci. Technol., vol. 12, pp. 1515-1548 (1997).

Q. Y. Tong et al Extracts of "Semi-conductor on wafer bonding", Science and Technology, Interscience Technology, Wiley Interscience publication, Johnson Wiley & Sons, Inc.

J.P. Collinge, :"Silicon-on-insulator technology", Materials to VLSI, 2nd Edition, Kluwer Academic Publisher, pp. 50-51.

* cited by examiner

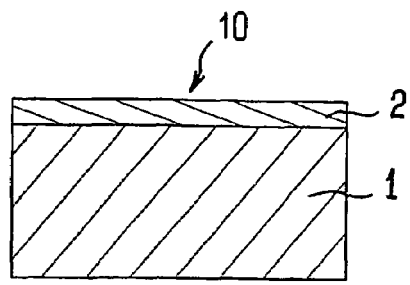
FIG_1a
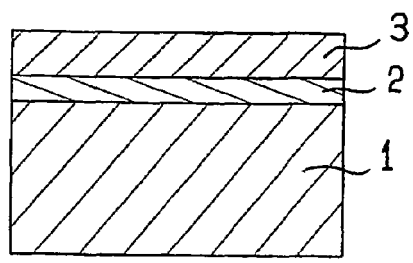
FIG_1b
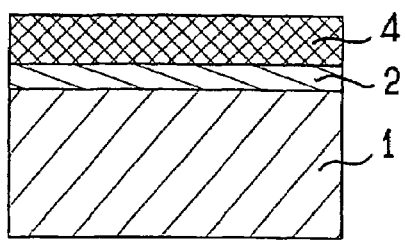
FIG_1c
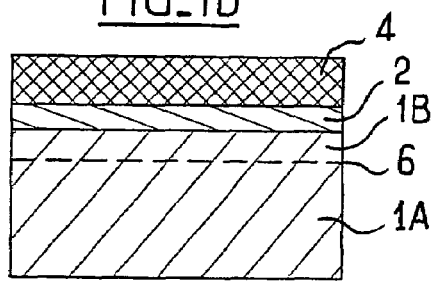
FIG_1d
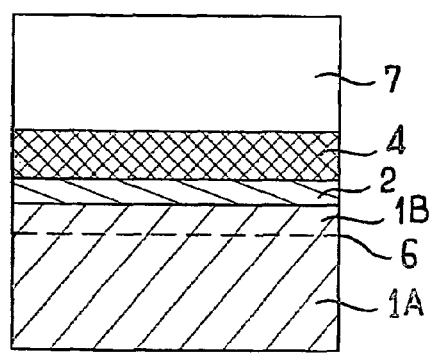
FIG_1e
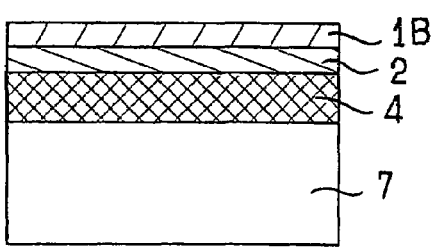
FIG_1f
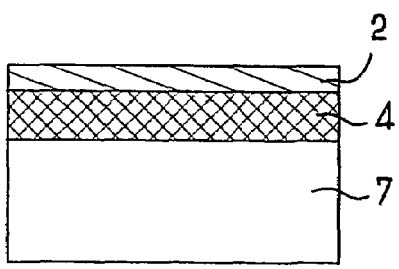
FIG_1g
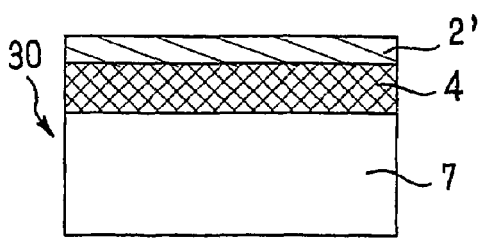
FIG_1h
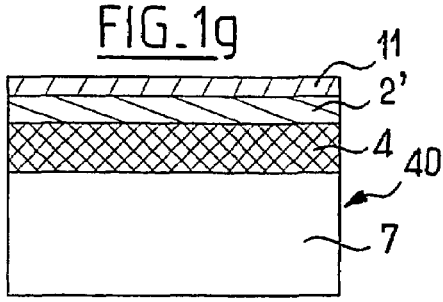
FIG_1i

METHOD FOR FORMING A RELAXED OR PSEUDO-RELAXED USEFUL LAYER ON A SUBSTRATE

CROSS-REFERENCE TO RELATED APPLICATIONS

This application is a continuation of international application PCT/IB2004/00931 filed Mar. 1, 2004, and a continuation-in-part of copending application Ser. No. 10/784,017 filed Feb. 20, 2004 now abandoned which claims the benefit of provisional application 60/483,479 filed Jun. 26, 2003. The content of each application is expressly incorporated herein by reference thereto.

BACKGROUND ART

The present invention relates to the formation of a relaxed or pseudo relaxed layer on a substrate, the relaxed layer being in a material selected from among semiconductor materials, in order to form a final structure intended for electronics, optics or optoelectronics. For example, a semiconductor-on-insulator structure may be formed. The present invention comprises in particular the formation of a layer strained on and by the relaxed layer.

A Si layer strained by a relaxed or pseudo-relaxed SiGe layer may achieve advantageous properties such as a charge carrier mobility that is about 100% more significant than that present within a relaxed Si layer. A layer is "relaxed" if its crystalline material has a mesh parameter approximately identical to its nominal mesh parameter, in other words, substantially identical to the mesh parameter of the material in equilibrium. Conversely, the term "strained" is applied to any layer of crystalline material whose crystalline structure is strained resiliently in tension or in compression during crystal growth, such as epitaxy, which forces its mesh parameter to be appreciably different from the nominal mesh parameter.

It is known to form a relaxed layer on a substrate, particularly by implementing a method that includes epitaxy of a thin layer of semiconductor material on a donor substrate, bonding a receiver substrate on the thin layer, and removing the donor substrate. A semiconductor-on-insulator (SOI) structure can be made in this way, in which the semiconductor thickness is formed at least partly by the thin relaxed layer. The insulating layer is usually formed between the epitaxial growth and bonding steps. Relaxation of the thin layer can occur during the epitaxial growth step, or may occur during a subsequent treatment.

In the first case, it is known to use a donor substrate that includes a carrier substrate and a buffer layer. The buffer layer contains plastic deformations so that the covering epitaxial thin layer is relaxed of all strain. Processes for producing such a layer are for example described in U.S. Pat. No. 6,573,126 and in International Publication No. WO 99/53539. However, a buffer layer often takes a relatively long time to fabricate, and is costly to obtain.

In the second case, the donor substrate does not include a buffer layer and then a thin layer is epitaxially grown so that it is strained by the donor substrate. In this way, for example, a SiGe layer will be grown directly on a Si substrate to have a thickness such that the SiGe layer is strained overall.

A first technique for relaxing such a SiGe layer is described in the document by B. Hollander and colleagues entitled "Strain relaxation of pseudomorphic $Si_{1-x}Ge_x$/Si (100) heterostructures after hydrogen or helium ion implantation for virtual substrate fabrication" (in Nuclear and Instruments and Methods in Physics Research B 175-177 (2001) 357-367). This method includes relaxing the SiGe layer, prior to bonding a receiver substrate onto a thin layer, by implanting hydrogen or helium ions in the Si substrate at a preset depth. However, relaxation rates usually obtained by this technique remain quite low relative to other techniques.

Research into a second technique is disclosed in the document entitled "Compliant Substrates: A comparative study of the relaxation mechanisms of strained films bonded to high and low viscosity" by Hobart and colleagues (Journal of electronic materials, vol 29, No 7, 2000). After removing the donor substrate, thermal treatment is applied to relax or pseudo-relax a strained SiGe layer that has been bonded to a borophosphoro silicate glass (BPSG). During the thermal treatment, the strained layer appears to relax because the layer of glass becomes viscous at the treatment temperature. It would be advantageous to use a layer of BPSG with a fairly low viscosity temperature $T_G$ (of the order of 625° C.). However, due to the viscosity of the BPSG layer obtained at these temperatures, subsequent thermal treatments at temperatures above $T_G$, may have undesired effects, particularly on the structure of the treated wafer. Thus, for example, if transistors are made in the relaxed or pseudo-relaxed SiGe layer or in a strained Si layer grown on the relaxed or pseudo-relaxed SiGe layer, at a temperature above $T_G$ some of the strains may relax because the layer of glass becomes viscous, which removes strains from the Si layer and adds strains in the SiGe layer. Such a result is contrary to the goal of retaining a relaxed SiGe layer and straining the Si layer as far possible. Thus, improvements in such techniques are desirable and necessary, and these are provided by the present invention.

SUMMARY OF THE INVENTION

The present invention relates to a method for forming a relaxed or pseudo-relaxed useful layer on a substrate. This method includes growing a strained semiconductor layer on a donor substrate; bonding a receiver substrate to the strained semiconductor layer by a vitreous layer of a material that becomes viscous above a certain viscosity temperature to form a first structure; detaching the donor substrate from the intermediate composite to form a second structure comprising the receiver substrate, the vitreous layer, and the strained layer; and heat treating the second structure at a temperature and time sufficient to relax strains in the strained semiconductor layer and to form a relaxed or pseudo-relaxed useful layer on the receiver substrate. Preferably, the donor substrate that includes a buffer layer and at least one strained semiconductor layer is grown on the buffer layer. If desired, the one strained layer may include a first layer of strained silicon and a second later of strained silicon-germanium.

The vitreous layer is advantageously formed on the strained layer or receiver substrate prior to bonding. In one embodiment, the vitreous layer is provided by growing a semiconductor material layer on the strained layer and applying a controlled treatment to convert at least part of the semiconductor material layer into a material which is viscous above the certain viscosity temperature. Thus, the second structure is heat treated at a temperature that is at least about or above the certain viscosity temperature. For example, the viscosity temperature of the vitreous layer can be greater than about 900° C. so that the heat treating occurs at a temperature above about 900° C. to about 1500° C.

When the semiconductor material layer comprises silicon, the controlled treatment may be a controlled thermal oxidation treatment that converts at least part of the silicon layer into a silicon oxide vitreous layer. This forms an inserted layer between the vitreous layer and the strained layer, and the inserted layer can become at least a partially strained layer after the heat treatment. Also, a strained semiconductor layer can be grown on the useful layer. This allows optic, electronic or optoelectronic components to be fabricated in either the useful layer or the strained semiconductor layer.

If desired, a bonding layer of material can be applied onto at least one of the vitreous layer, the receiver substrate or the strained layer prior to the bonding step. A preferred bonding layer comprises silicon oxide.

Further structures can be obtained by providing a zone of weakness in the donor substrate or the strained layer so that the donor substrate can be detached along the zone of weakness. Thus, after detachment, a third structure comprising the receiver substrate, the vitreous layer, the strained layer and a layer of donor material is formed. If desired, the layer of donor material can be removed before heat treating the third structure.

In a preferred embodiment, the buffer layer includes a first layer of silicon-germanium of variable composition and a second layer of silicon-germanium of constant composition. Advantageously, the donor substrate comprises a bulk structure of single crystal silicon, the first layer has a silicon content that varies from 100% adjacent the donor substrate to 0% adjacent the second layer. To obtain this structure, the buffer layer may be formed by stacking layers of different composition on the donor substrate. The second layer of the buffer layer may be a relaxed silicon-germanium layer, and the strained layer is grown upon it.

BRIEF DESCRIPTION OF THE DRAWINGS

Other aspects and advantages of the present invention will become clear from reading the following detailed description of the preferred methods of the invention, given by way of example and with reference to the appended drawings, in which:

FIGS. 1a to 1i illustrate the steps of a first method according to the invention.

DETAILED DESCRIPTION OF THE PREFERRED EMBODIMENTS

Figure 2A:
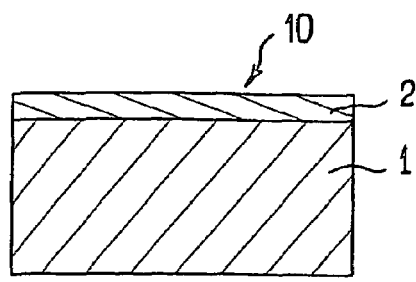
FIGS. 2a to 2i show the steps of a second method according to the invention.
Figure 2B:
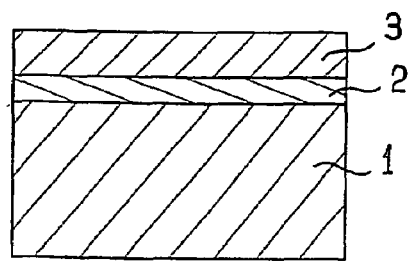

Provided are techniques for forming a useful relaxed or pseudo-relaxed layer on a substrate. A "useful layer" is a layer that receives components during subsequent treatments for use in electronics, optics, or optoelectronics.

The technique also involves forming a useful layer of strained material on the relaxed or pseudo-relaxed layer. The present method also makes it possible to retain an at least relative relaxation strength of an initially strained layer, during high temperature thermal treatments. In particular, at least the relative relaxation strength of a layer of $Si_{1-x}Ge_x$ adjacent to a vitreous layer is retained, up to a temperature of approximately between about 900° C. and about 1200° C., or even at a higher temperature.

Thermal treatments may be applied during epitaxial growth on the relaxed $Si_{1-x}Ge_x$ layer, or during other processes, such as for example when fabricating components in the $Si_{1-x}Ge_x$ layer and/or in an epitaxial over-layer, which could be a strained Si layer.

The method according to the invention includes growing a thin layer of semiconductor material on a donor substrate, bonding a receiver substrate onto the thin layer, and removing the donor substrate. FIGS. 1a to 1i illustrate a preferred method.

FIG. 1a shows a source wafer 10 that includes a donor substrate 1 and a strained $Si_{1-x}Ge_x$ layer 2. In a first configuration, the donor substrate 1 is made entirely of monocrystalline Si which has a first mesh parameter. Such a donor substrate 1 is advantageously obtained by Czochralski growth. A second configuration includes a donor substrate 1 that is a pseudo-substrate having an upper Si layer (not shown in FIG. 1) and an interface with the strained layer 2 that has a first mesh parameter. The first mesh parameter of the upper Si layer is advantageously the nominal mesh parameter of Si, so that it is in a relaxed state. The upper Si layer additionally has a sufficiently large thickness such that it can impose its mesh parameter on the overlying strained layer 2, without the strained layer significantly influencing the crystalline structure of the upper layer of the donor substrate 1. Whichever configuration is chosen for the donor substrate 1, it has a crystalline structure with a low density of structural defects, such as dislocations.

Preferably, the strained layer 2 is made of a single thickness of $Si_{1-x}Ge_x$. The concentration of Ge in this strained layer 2 is preferably above 17%, i.e. a value of x above 0.17. Since Ge has a mesh parameter about 4.2% higher than Si, the material selected to form the strained layer 2 thus has a second nominal mesh parameter which is appreciably higher than the first mesh parameter. Thus, the strained layer 2 is strained resiliently in compression by the donor substrate 1. That is, it is strained from having a mesh parameter that is appreciably lower than the second nominal mesh parameter of the material of which it is made, and therefore from having a mesh parameter close to the first mesh parameter. In addition, the strained layer 2 preferably has an approximately constant atomic element composition.

The strained layer 2 is advantageously formed on the donor substrate 1 by crystal growth, such as by epitaxial growth, using known techniques such as, for example, LPD, Chemical Vapor Deposition (CVD) and Molecular Beam Epitaxy (MBE). It is advantageous to choose crystalline materials made of the donor substrate 1 and the strained layer 2 (in the vicinity of its interface with the carrier substrate 1) so that a sufficiently small difference exists between the first and the second respective nominal mesh parameters to obtain a strained layer 2 without too many crystallographic defects. Such a technique avoids, for example, point defects or extensive defects such as dislocations. The difference in mesh parameter is typically between about 0.5% and about 1.5%, but can also have more significant values. For example, $Si_{1-x}Ge_x$ with x=0.3 has a nominal mesh parameter about 1.15% higher than that of Si. But it is preferable for the strained layer 2 to be of approximately constant thickness, so that it presents approximately constant intrinsic properties and/or to facilitate the future bonding with the receiver substrate 5 (as shown in FIG. 1e).

The thickness of the strained layer 2 must additionally remain below a critical elastic strain thickness to avoid relaxation or an appearance of internal plastic deformations. The critical elastic strain thickness depends mainly on the material selected for the strained layer 2 and on the mesh parameter difference with the donor substrate 1. But it also depends on growth parameters such as the temperature at which it has been formed, or on the nucleation sites from which it has been grown, or on the growth techniques employed (for example CVD or MBE).

Critical thickness values for $Si_{1-x}Ge_x$ layers can be found by reference to the document entitled "High mobility Si and Ge structures" by Friedrich Schaffler ("Semiconductor Science Technology" 12 (1997) 1515-1549). For other materials, a skilled person can refer to the prior art to find the critical elastic strain thickness values of the material selected for the strained layer 2 that has been formed on the donor substrate 1. Thus, for a layer of $Si_{1-x}Ge_x$ where x is between 0.1 and 0.3, a typical thickness of between about 200 Å and 2000 Å will be chosen, preferably between 200 Å and 500 Å with consideration given to the growth parameters. Once formed, the strained layer 2 therefore has a mesh parameter approximately in the vicinity of that of its growth substrate 1, and has internal resilient strains under compression.

FIG. 1c illustrates a vitreous layer 4 formed on the strained layer 2, and the vitreous layer could also be formed on the receiver substrate 7. The material of the vitreous layer 4 becomes viscous above a viscosity temperature $T_G$. In the framework of the present method, a material is chosen for the vitreous layer 4 which has a minimum high viscosity temperature $T_G$ of about 900° C. This high viscosity temperature makes it possible to conduct high temperature thermal treatments without causing the vitreous layer 4 to become viscous. Thus, with reference to FIGS. 1h and 1i, the structures 30 or 40 resulting from performing the present method will not have a part of their crystallographic structure modified by a viscous vitreous layer 4. A single thermal treatment at a temperature around or above $T_G$ will however be applied during the process (with reference to FIG. 1h) to relax the strained layer 2. It is particularly advantageous to be able to retain the at least relative relaxation strength (which is obtained during a step with reference to FIG. 1h) of the $Si_{1-x}Ge_x$ layer up to a temperature of somewhere around 900° C. or even at a higher temperature.

The material of the vitreous layer 4 is advantageously at least one of $SiO_2$ or $SiO_xN_y$. When a vitreous layer 4 of $SiO_xN_y$ is formed, it is possible to vary the value of y in order to change the viscosity temperature $T_G$ which, for this material, depends substantially on the nitrogen component. Thus, when the y content of the composition increases it is possible for the temperature $T_G$ of the vitreous layer to be changed typically between a $T_G$ of roughly that of $SiO_2$ (which may vary around 1150° C.) and a $T_G$ of roughly that of $Si_3N_4$ (which is above 1500° C.). By varying the y parameter, it is thus possible to cover a wide range of viscosity temperatures $T_G$. When the viscosity temperature $T_G$ depends on the material of the vitreous layer, it may also fluctuate depending upon the conditions under which it has been formed. In one advantageous scenario, it will thus be possible to control the formation conditions of the vitreous layer 4 so as to preselect a viscosity temperature $T_G$. It is thus possible to vary deposition parameters, such as the temperature, the time, the proportion of materials, and the gaseous atmosphere potential, to affect the $T_G$ temperature.

Doping elements may thus be added to the principal gaseous elements contained in the vitrification atmosphere, such as boron and phosphorus which may also operate to reduce the viscosity temperature $T_G$. The vitreous layer 4 is preferably deposited before the germanium contained in the strained layer 2 can diffuse into the atmosphere, or onto the receiver substrate 7, particularly when the assembly is subjected to high temperature thermal treatment, such as RTA annealing treatment, or a sacrificial oxidation treatment.

In a preferred method of forming the vitreous layer 4, the following steps are implemented. A layer 3 of semiconductor material is grown on the strained layer 2 as shown in FIG. 1b. Next, a controlled treatment is applied to convert at least part of the layer 3 into a material which becomes viscous above the viscosity temperature, to form the vitreous layer 4. The material chosen for the layer 3 is advantageously Si so as not to modify the strain in the strained layer 2. The thickness of the formed layer 3 is typically between 5 Å and about 5000 Å, and may be more particularly between 100 Å and about 1000 Å.

For the same reasons as those set out above, the crystal growth of the layer 3 is preferentially implemented before diffusion of Ge, in other words shortly after:
  the formation of the strained layer 2, if the temperature for forming the strained layer 2 is maintained;
  a rise in temperature subsequent to a drop to ambient temperature obtained immediately after the formation of the strained layer 2.

A preferential method is to grow the layer 3 in situ directly after growth of the strained layer 2. The growth technique used for layer 3 may be an epitaxy technique such as LPD, CVD, or MBE. The vitreous layer 4 may be obtained by thermal treatment in an atmosphere with a preset composition. Thus, when the Si layer 3 is converted to the vitreous layer 4 of $SiO_2$, it may be subjected to a controlled thermal oxidation treatment in order to convert the layer 3 into a vitreous layer. During this final step, it is important to have the correct proportions of oxidizing treatment parameters (such as the temperature, duration, oxygen concentration, the other gases of the oxidizing atmosphere, etc.) in order to control the thickness of the oxide that is formed, and to stop oxidation in the vicinity of the interface between the layer 2 and the layer 3. For such thermal oxidation, a dry oxygen or water vapor atmosphere can be used, at a pressure equal to or above 1 atm. It will then be preferable to vary the duration of oxidation in order to control the oxidation of the layer 3. However, such control may be achieved by varying one or more other parameters, alone or in combination with the time parameter. Further details can be found in U.S. Pat. No. 6,352,942 regarding forming such a vitreous $SiO_2$ layer 4 on a SiGe layer.

Another embodiment for forming the vitreous layer 4 replaces the two steps shown by FIGS. 1b and 1c respectively. In particular, immediately after the growth of the strained layer 2 (in order to prevent the diffusion of the Ge) atomic species are deposited to form the vitreous material using atom species deposition means. Thus, it is possible for example to deposit molecules of $SiO_2$ on the strained layer 2 to form the vitreous $SiO_2$ layer 4.

In another variation, the vitreous layer 4 may be formed by first depositing amorphous Si atomic species to form an amorphous Si layer on the strained $SiO_2$ layer, and then thermally oxidizing this amorphous Si layer to make a vitreous $SiO_2$ layer 4.

FIGS. 1d, 1e and 1f illustrate the steps for removing the strained layer 2 and the vitreous layer 4 from the donor substrate 1 so as to transfer them to a receiver substrate 7. The method is composed of two main sequential steps:
  bonding the receiver substrate 7 onto the vitreous layer 4, which is part of an assembly that includes the donor substrate 1, strained layer 2, and vitreous layer 4; and
  removing the donor substrate 1.

With reference to FIG. 1e, the receiver substrate 7 is bonded to the vitreous layer 4. Prior to bonding, an optional step of forming a bonding layer on the surface of the receiver substrate 7 may be implemented. The bonding layer has binding properties, at an ambient temperature or at higher temperatures, with the material of the vitreous layer 4. Thus, for example, forming a layer of $SiO_2$ on the receiver substrate 7 may improve the quality of bonding, particularly if the vitreous layer 4 is $SiO_2$. The bonding layer of $SiO_2$ is then obtained to advantage by deposition of atomic species of $SiO_2$ or by thermal oxidation of the surface of the receiver substrate 7 if its surface is Si. A bonding surface preparation step is advantageously used, prior to bonding, to render these surfaces as smooth and as clean as possible.

Adapted chemical treatments for cleaning the bonding surfaces may be applied, such as light chemical etching, RCA treatment, ozone baths, flushing operations, and the like. Mechanical or mechano-chemical treatments may also be applied, such as polishing, abrasion, Chemical Mechanical Planarization (CMP) or atomic species bombardment.

Bonding as such is achieved by bringing the bonding surfaces into contact with each other. The bonds are preferably molecular in nature making use of the hydrophilic properties of the bonding surfaces. To improve the hydrophilic properties of the bonding surfaces, the two structures to be bonded may be subject to immersion operations in baths, for example, flushing in de-ionized water. The bonded assembly may additionally be annealed in order to reinforce the bonds, for example, by modifying the nature of the bonds, such as covalent bonds or other bonds. Thus, when the vitreous layer 4 is made of $SiO_2$, annealing may enhance the bonds, particularly if a bonding layer of $SiO_2$ has been formed prior to bonding on the receiver substrate 7.

For more detail regarding bonding techniques reference may be made to the document entitled "Semiconductor Wafer Bonding" (Science and technology, Interscience Technology) by Q. Y. Tong, U. Gösele and Wiley.

Once the assembly is bonded, material is preferably removed by detaching the donor substrate 1 at the level of a weakened zone 6 present in the donor substrate 1, for example, by using mechanical energy. With reference to FIGS. 1d and 1e, this weakened zone 6 is a zone approximately parallel to the bonding surface and has weakened bonds between the lower part 1A of the donor substrate 1 and the upper part 1B of the donor substrate 1. These brittle bonds can be broken by force, such as by using thermal or mechanical energy.

According to a first embodiment of the zone of weakness 6, a technique called SMART-CUT® may be applied. This method includes implanting atomic species in the donor substrate 1, at the level of the zone of weakness 6. The implanted species may be hydrogen, helium, a mix of these two species or other light species. In an implementation, implantation preferably takes place just prior to bonding.

The implantation energy is selected so that the species, implanted through the surface of the vitreous layer 4, pass through the thickness of the vitreous layer 4, the thickness of the strained layer 2 and a set thickness of the upper part 1B of the receiver substrate 1. It is preferable to implant sufficiently deep in the donor substrate 1 such that the strained layer 2 will not to be subjected to damage during the step of detaching the donor substrate 1. The depth of implantation in the donor substrate is thus typically about 1000 Å.

The brittleness of the bonds in the zone of weakness 6 is found principally by choosing the proportion of the implanted species, the proportions being typically between about $10^{16}$ cm$^{-2}$ and $10^{17}$ cm$^{-2}$, and more exactly between about $2.10^{16}$ cm$^{-2}$ and about $7.10^{16}$ cm$^{-2}$. Detachment at the level of the zone of weakness 6 is then usually effected by using mechanical and/or thermal energy.

For more detail about the SMART-CUT® method, reference may be made to the document entitled "Silicon-On-Insulator Technology: Materials to VLSI, 2$^{nd}$ Edition" by J.-P. Colinge published by "Kluwer Academic Publishers", pages 50 and 51.

According to a second embodiment of the zone of weakness 6, a technique is applied which is described in U.S. Pat. No. 6,100,166. The weakened zone 6 is obtained before the formation of the strained layer 2, and at the time of formation of the donor substrate 1. In this case, the weakened zone or layer is made by:
    forming a porous layer on a carrier substrate 1A of Si;
    growing a Si layer 1B on the porous layer.

The carrier substrate 1A, porous layer, and Si layer 1B assembly then forms the donor substrate 1, and the porous layer is the weakened layer 6 of the donor substrate 1. Input of thermal and/or mechanical energy at the level of the porous weakened zone 6 results in detachment of the carrier substrate 1A from the layer 1B.

The preferred techniques for removing material at the level of a weakened zone 6, obtained according to one of the two non-restrictive embodiments above, makes it possible to rapidly remove a substantial part of the donor substrate 1. It also allows the removed part 1A of the donor substrate 1 to be reused in another operation, such as one according to the present method. Thus, a strained layer 2 and possibly another part of a donor substrate and/or other layers may be reformed on the removed part 1A, preferably after the surface of the removed part 1A has been polished.

With reference to FIG. 1f, after detachment of the part 1A, finishing techniques such as polishing, abrasion, Chemical Mechanical Planarization (CMP), thermal RTA annealing, sacrificial oxidation, chemical etching, taken alone or in combination, can be applied to remove layer 1B and to perfect the stack (reinforcing the bonding interface, eliminating roughness, curing defects, etc.). A selective chemical etching step, taken in combination or not with mechanical means, may advantageously be applied at least as a final step. Thus, solutions based on KOH, NH$_4$OH (ammonium hydroxide), TMAH, EDP or HNO$_3$ or solutions currently being studied combining agents such as HNO$_3$, HNO$_2$H$_2$O$_2$, HF, H$_2$SO$_4$, H$_2$SO$_2$, CH$_3$COOH, H$_2$O$_2$, and H$_2$O (as explained in the document WO 99/53539, page 9) may be advantageously employed in order to etch the Si part 1B selectively in respect of the strained $Si_{1-x}Ge_x$ layer 2.

After the bonding step, another technique to remove material without detachment and without a weakened zone may be applied according to the invention in order to remove the donor substrate 1. For example, chemical and/or mechano-chemical etching could be used.

The material or materials of the donor substrate 1 to be removed may for example be etched possibly selectively, according to an "etch-back" process. This technique consists in etching the donor substrate 1 "from behind", in other words from the free surface of the donor substrate 1. Wet etching operations implementing etching solutions adapted to the materials for removal may also be applied. Dry etching operations may also be applied to remove the material, such as plasma etching or sputter etching. The etching operation or operations may additionally be only chemical or electro-chemical or photo-electrochemical. The etching operation or operations may be preceded by or followed by a mechanical attack on the donor substrate 1, such as lapping, polishing, mechanical etching or sputtering with atomic species. The etching or etching operations may be accompanied by a mechanical attack, such as polishing possibly combined with action by mechanical abrasives in a CMP process.

All the above-mentioned techniques for removing material from the donor substrate 1 are proposed by way of example, but do not in anyway constitute a restriction, since the present method extends to all types of techniques able to remove material from the donor substrate 1.

With reference to FIG. 1g, after material removal a structure is obtained comprising the receiver substrate 7, the vitreous layer 4 and the strained layer 2. With reference to FIG. 1h, thermal treatment is then applied at a temperature close to or above the viscosity temperature $T_G$. The main purpose of this thermal treatment is to relax the strains in the strained layer 2. Thermal treatment at a temperature above or around the viscosity temperature of the vitreous layer 4 will cause the latter layer to turn viscous, which will allow the strained layer 2 to relax at its interface with the vitreous layer 4, leading to decompression of at least some of its internal strains. Thus, when the vitreous layer 4 is of $SiO_2$ and was obtained by thermal oxidation, thermal treatment at about 1050° C. minimum, preferentially at about 1200° C. minimum, for a preset time will cause a relaxation or pseudo-relaxation of the strained layer 2. The thermal treatment may last typically from a few seconds to several hours. The strained layer 2 therefore becomes a relaxed layer 2'.

Other effects of the thermal treatment on the structure may be sought, apart from the relaxation of the strained layer 2. For example, another objective of thermal treatment may additionally be to obtain a bonding reinforcement anneal between the receiver substrate 7 and the vitreous layer 4. Indeed, since the temperature selected for the thermal treatment is above or around the viscosity temperature of the vitreous layer 4, the vitreous layer temporarily turns viscous, which may create particular and stronger adhesion bonds with the receiver substrate 7. The result, therefore, is a structure 30 composed of relaxed $Si_{1-x}Ge_x$ layer 2', a vitreous layer 4, and a receiver substrate 7. This structure 30 is a Silicon Germanium On Insulator (SGOI) structure where the vitreous layer 4 is electrically insulating, such as for example a vitreous layer 4 of $SiO_2$. The layer of relaxed $Si_{1-x}Ge_x$ 2' of this structure then presents a surface having a surface roughness compatible with growth of another crystalline material. A light surface treatment, such as polishing, adapted to $Si_{1-x}Ge_x$ may possibly be applied to improve the surface properties.

With reference to FIG. 1i, and in an optional step, a Si layer 11 is grown on the relaxed $Si_{1-x}Ge_x$ 2' layer with a thickness appreciably less than the critical strain thickness of the material of which it is composed, and which is therefore strained by the relaxed $Si_{1-x}Ge_x$ 2' layer. The result is a structure 40 composed of a strained Si, a relaxed $Si_{1-x}Ge_x$ 2' layer, a vitreous layer 4, and a receiver substrate 7. This structure 40 is a Si/SGOI structure where the vitreous layer 4 is electrically insulating, such as for example, a vitreous layer 4 of $SiO_2$.

Figure 2C:
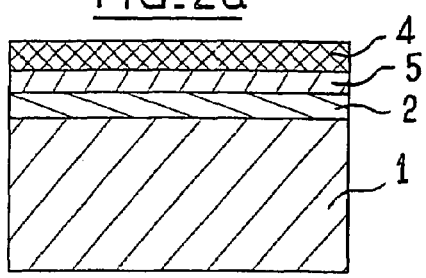
Figure 2D:
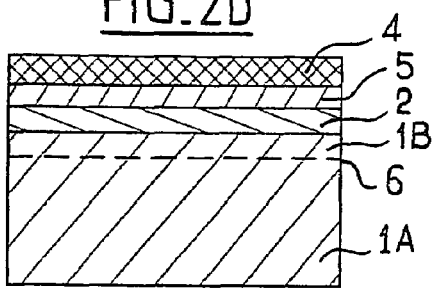
Figure 2E:
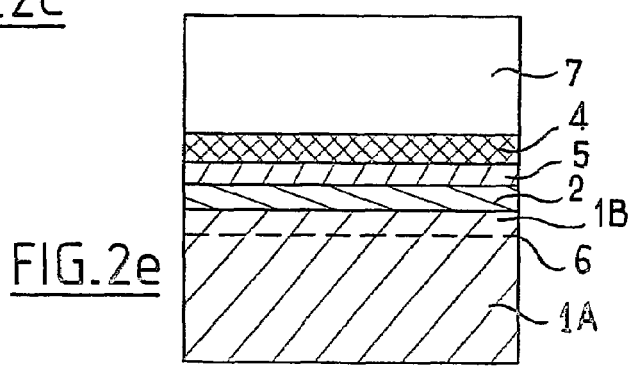
Figure 2F:
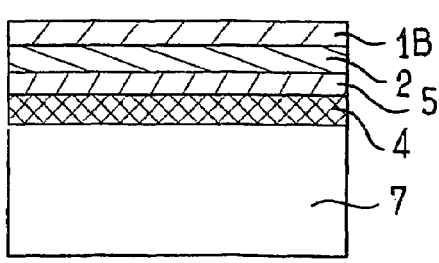
Figure 2G:
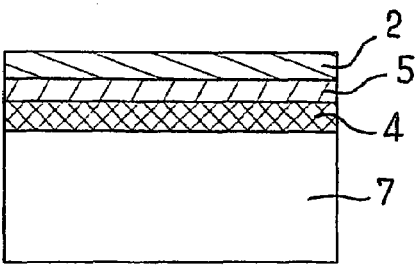

An alternative to this method is presented with reference to FIGS. 2a to 2i. With reference in particular to FIG. 2c, the method is the same on the whole as that described with reference to FIGS. 1a to 1i, with the exception of the step of conversion of the layer 3 into a vitreous layer 4. That step is implemented here in such a way that less than the whole layer 3 is converted. There thus remains a an inserted layer 5 between the vitreous layer 4 and the strained layer 2. This inserted layer 5 has a thickness of around 10 nm, and in all cases a thickness that is very much less than that of the strained layer 2, and typically by a factor of at least 5 to as much as 10 to 100 or 1000, as desired or necessary.

During thermal treatment to relax the strain of the strained layer 2, the strained layer will seek to reduce its internal elastic strain energy by virtue of the viscous properties of the vitreous layer 4. Given that the inserted layer 5 is of less thickness relative to the overlying strained layer 2, the strained layer 2 will impose its relaxation requirement on the inserted layer 5. The strained layer 2 thus forces the inserted layer 5 to at least partially strain. The strained layer 2 then becomes an at least partially relaxed layer 2', and the relaxed inserted layer 5 then becomes a strained inserted layer 5'. A discussion concerning this last point can be found in U.S. Pat. No. 5,461,243, at column 3, lines 28 to 42.

Figure 2H:
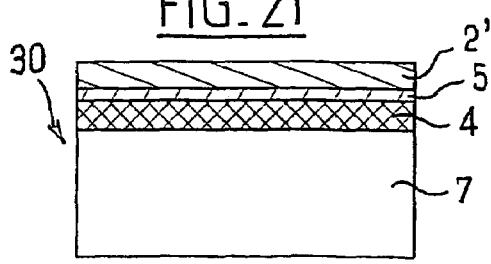

With reference to FIG. 2h, the inserted strained layer 5' is retained after the thermal treatment to relax the strained layer 2. The structure 30 that is formed includes a relaxed $Si_{1-x}Ge_x$ layer, a strained Si layer, a vitreous layer 4, and a receiver substrate 7. This structure 30 is a SG/SOI structure, where the vitreous layer 4 is electrically insulating, such as for example a vitreous layer 4 of $SiO_2$.

It is then possible to remove, for example, by selective chemical etching based on $HF:H_2O_2:CH_3COOH$ (selectivity of about 1:1000), the relaxed $Si_{1-x}Ge_x$ layer 2', in order to result in a strained Si layer, a vitreous layer 4, and a receiver substrate 7 structure. This structure is a strained SOI structure, where the vitreous layer 4 is electrically insulating, such as for example a vitreous layer 4 of $SiO_2$.

Figure 2I:
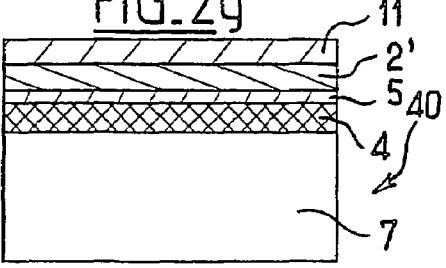

Instead of implementing chemical etching, a Si layer may be grown, with reference to FIG. 2i, on the relaxed layer 2' so as to form a strained Si layer 11, approximately identical to the one in FIG. 1i. The structure 40 that is formed includes a strained Si layer, a relaxed $Si_{1-x}Ge_x$ layer, a strained Si layer, a vitreous layer 4, and a receiver substrate 7. This structure 40 is a Si/SG/SOI structure, where the vitreous layer 4 is electrically insulating, such as for example a vitreous layer 4 of $SiO_2$.

In one particular scenario where the thermal treatment to relax the strains of the strained layer 2 is carried out at a temperature and for a time period greater, respectively, than a temperature and a reference time period beyond which the Ge diffuses in the Si, the Ge contained in the strained layer 2 may diffuse into the inserted strained layer 5'. This is why it is preferable to implement the relaxation of the strained SiGe layer 2 before growing the strained Si layer 11. But, in some cases, this diffusion effect, if it is appropriately controlled, may be desirable. Thus, diffusion can be controlled in such a way that the Ge species are distributed uniformly in the two layers 2 and 5, forming a single layer of $Si_{1-x}Ge_x$ having a substantially uniform Ge concentration. A discussion of this latter point can be found in U.S. Pat. No. 5,461,243, at column 3, lines 48 to 58.

According to one or other of the two preferred methods described above, or according to an equivalent, additional steps can be followed for making components. Preparation steps for the making of components may be implemented during the method, and at a minimum temperature of about 900° C. without distorting the strain factor of the relaxed layer 2' and of the strained layer 11. Such preparation steps may be implemented in the strained SiGe layer 2 of the SGOI structure referenced in FIG. 1g, or in the relaxed or pseudo-relaxed SiGe layer 2' of the SGOI structure referenced in FIG. 1h, or in the strained Si layer 11 of the Si/SGOI structure referenced in FIG. 1i. Local treatments may for example be undertaken to etch patterns in the layers, for example by lithography, by photolithography, by reactive ion etching or by any other etching with pattern masking. In one particular case, patterns such as islets can be etched into the strained SiGe layer 2 in order to contribute to the effective relaxation of the strained layer 2 when applying the thermal relaxation treatment.

One or more steps for making components, such as transistors, in the strained Si layer 11 (or in the relaxed SiGe layer 2', where the latter is not coated with a strained Si layer 11) may particularly be implemented at a minimum temperature of about 900° C. without distorting the strain factor of the relaxed layer 2' and of the strained layer 11. In a particular process according to the present method, component-making steps are implemented during, or in continuation of, the thermal treatment to relax the strained SiGe layer 2. Further, the strained Si layer epitaxy step may be implemented during or in continuation of component making steps.

Figure 3:
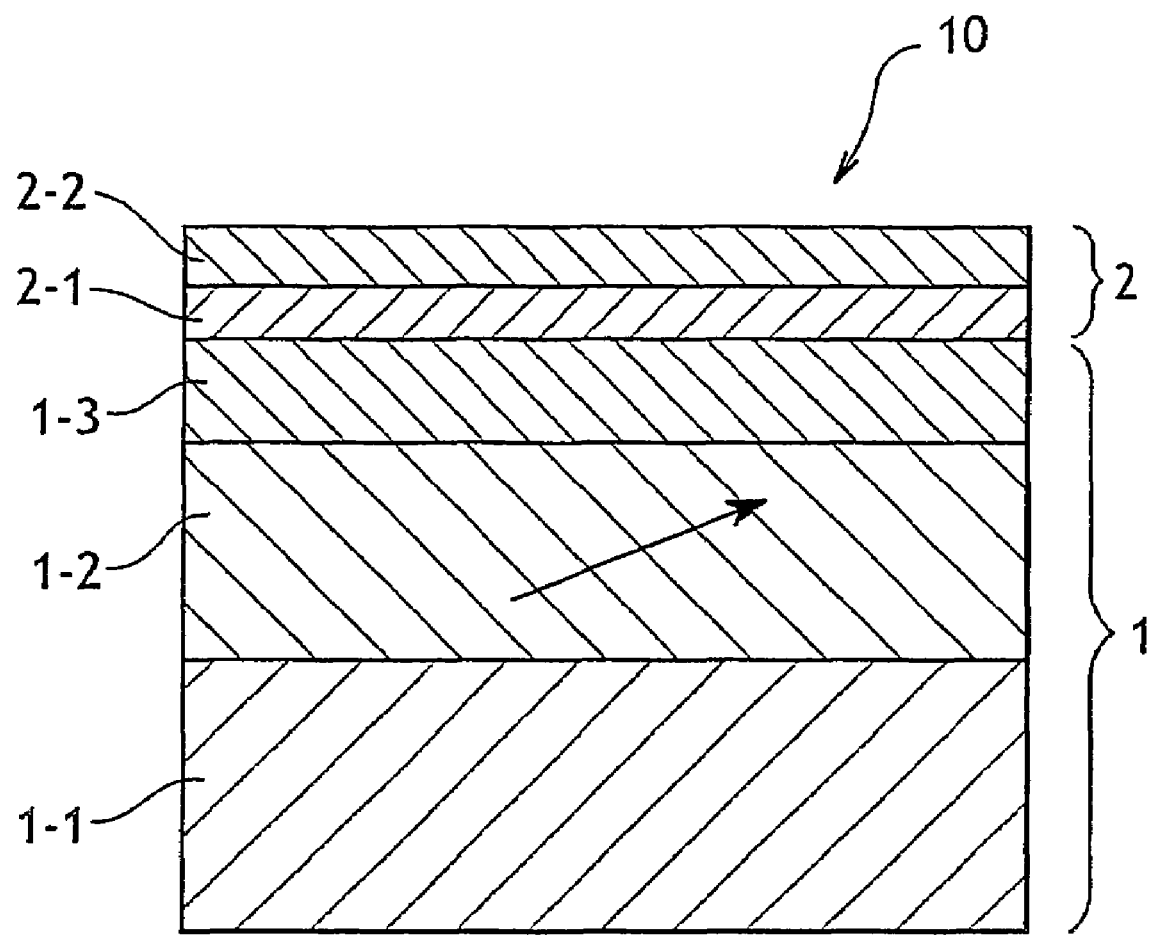
FIG. 3 shows an example of a source wafer, with layers to be transferred grown on a buffer structure in SiGe.

FIG. 3 represents a source wafer 10 before the formation of the zone of weakness 6 and the formation of the vitreous layer 4. This embodiment differs from the examples previously detailed referring to FIGS. 1*a* to 1*i* and 2*a* to 2*i* by the way of choosing the materials constituting the donor substrate 1 and the strained layer 2. Here, the donor substrate 1 is composed of a holding substrate 1-1 of Si and a buffer structure composed of a buffer layer 1-2 in SiGe and an upper layer 1-3 in $Si_{1-z}Ge_z$. The holding substrate 1-1 is preferably in a bulk structure of single-crystal. The buffer layer 1-2 can for example be constituted of a stacking of layers so that the whole composition of Ge inside the buffer layer 1-2 gradually evolves from 0% at the interface with the holding substrate 1-2 to 100 z % of Ge at the interface with the upper layer 1-3 of $Si_{1-z}Ge_z$.

Contrary to the buffer layer 1-2, the upper layer 1-3 has a Ge composition constant in its thickness. The upper layer 1-3 has a thickness that is sufficiently great to assign its lattice parameter to the overlied layer. Furthermore, the upper layer 1-3 of $Si_{1-z}Ge_z$ has a relaxed structure.

Thus, the buffer structure (composed of the buffer layer 1-2 and the upper layer 1-3) allows:

an adaptation of the lattice parameter between the holding substrate 1-1 of Si and the nominal lattice parameter of $Si_{1-z}Ge_z$ of the upper layer 1-3;

a confinement of crystal defaults, the surface of the upper layer 1-3 being then without defaults or only having a few defaults.

Over the donor substrate 1, the strained layer 2 is grown by epitaxy techniques, such as CVD techniques (PECVD, MOCVD . . . ).

Firstly, a strained Si layer 2-1 is formed on the donor substrate 1 with a thickness no more than the critical thickness beyond which a such Si layer 2-1 starts to relax its elastic strains. A $Si_{1-x}Ge_x$ strained layer 2-2 is then formed on the last Si strained layer 2-1, so as to have a thickness less than the critical thickness of $Si_{1-x}Ge_x$ beyond which the elastic strains start to relax. Knowledge of the respective critical thickness of Si or $Si_{1-x}Ge_x$ can be found for instance in "High mobility Si and Ge structures" from Friedrich Schäffler ("Semiconductor science technology" 12 (1997) 1515-1549). The x-composition of Ge in the $Si_{1-x}Ge_x$ layer 2-2 is greater than the z-composition of Ge in the upper layer 1-3.

The strained layer 2 includes the Si strained layer 2-1 and the $Si_{1-x}Ge_x$ layer 2-2. The donor substrate 1 comprises the holding substrate 1-1, the buffer layer 1-2, and the upper layer 1-3 of $Si_{1-z}Ge_z$, and the previous examples, (presented referring to the FIGS. 1 and 2) disclose various embodiments of manufacturing a semiconductor-on-insulator structure 30 or 40, can then be easily transposed from the source wafer 10 of the FIG. 3, the zone of weakness 6 being formed in the upper layer 1-3 or in the buffer layer 1-2. Thereafter, a selective chemical etching is processed in order to remove the remaining part of the donor substrate 1, employing for instance an etch agent as HF:H2O2:CH3COOH (having a selectivity of about 1:1000 between SiGe and Si). The semiconductor-on-insulator structure finally obtained (not shown) comprises successively a receiving substrate 7, a vitreous layer 4, the $Si_{1-x}Ge_x$ strained layer 2-2 and the Si strained layer 2-1.

Then, a thermal treatment with a temperature close to or greater than the viscosity temperature of the vitreous layer 4 previously formed, is processed. This thermal treatment then relaxes at least partly the $Si_{1-x}Ge_x$ layer 2-2. The relaxed $Si_{1-x}Ge_x$ layer 2-2 imposes then elastic constraint to the top Si strained layer 2-1. Elastic constraints in the Si strained layer 2-1 (previously strained by the upper layer 1-3 of $Si_{1-z}Ge_z$) are then increased by the fact that x-composition of Ge is more important than z-composition. Thus, a semiconductor-on-insulator structure with a lattice parameter, in its semiconductor part, close to or equal to those of the $Si_{1-x}Ge_x$ material in its bulk configuration, is obtained.

Contrary to the prior art, this semiconductor-on-insulator structure is not obtained from a source wafer comprising a buffer structure adapting the parameter to a $Si_{1-x}Ge_x$, but from a buffer structure adapting the parameter to a $Si_{1-z}Ge_z$ with z<x. Now, a buffer structure which adapts a lattice parameter to a $Si_{1-x}Ge_x$ is thicker, comprises more stacking layers, and so is longer and more expansive to manufacture, than a buffer structure which adapts a lattice parameter to a $Si_{1-z}Ge_z$. This method according to the embodiment of the invention offers then technical and economical improvements comparing with the latter prior art.

The various techniques described in the invention are proposed by way of example in the present document, but do not in anyway constitute a restriction, since the invention extends to all types of techniques able to implement a method according to the invention.

One or more epitaxies of whatever kind may be applied to the final structure (structure 30 or 40 referenced in FIGS. 1*h*, 1*i*, 2*h*, 2*i*). For example, an epitaxy of a SiGe or SiGeC layer, or an epitaxy of a strained Si or SiC layer, or successive epitaxies of SiGe or SiGeC layers and Si or strained SiC layers may alternately be applied so as to form a multilayer structure. Once a final structure is obtained, finishing treatments, that may include for example annealing, may be applied.

The present invention is not restricted to a strained SiGe layer 2, but extends also to a composition of the strained layer 2 of other types of materials, such as the III-V or II-VI type, or to other semiconductor materials. Further, the techniques described are proposed by way of example and do not in anyway constitute a restriction, since the present invention extends to all types of techniques operable to implement the disclosed method.

It should also be understood that, in the layers of semiconductors discussed in this document, other constituents may be added. For example, carbon with a carbon concentration in the layer under consideration appreciably less than or equal to 50% may be added, and more particularly with a concentration of less than or equal to 5%.

What is claimed is:

1. A method for forming a relaxed or pseudo-relaxed useful layer on a substrate which comprises:

growing at least one strained semiconductor layer on a donor substrate that includes a buffer layer, with the strained semiconductor layer grown on the buffer layer;

directly bonding a receiver substrate to the strained semiconductor layer by a vitreous layer of a material that becomes viscous above a certain viscosity temperature to form a first structure;

detaching the donor substrate and buffer layer from the first structure to form a second structure comprising the receiver substrate, the vitreous layer, and the strained layer; and heat treating the second structure at a temperature and time sufficient to relax strains in one or more of the layers of the strained semiconductor layer to form a relaxed or pseudo-relaxed useful layer on the receiver substrate.

2. The method of claim 1, wherein the second structure is heat treated at a temperature that is at least about the certain viscosity temperature.

3. The method of claim 1, which further comprises growing a strained semiconductor layer on the useful layer.

4. The method of claim 1, which further comprises providing a zone of weakness in the donor substrate or one of the strained layers so that the donor substrate can be detached along the zone of weakness.

5. The method of claim 4, wherein the donor substrate is fabricated by forming a porous layer on a crystalline carrier substrate and growing a crystalline layer on the porous layer, such that the porous layer comprises the zone of weakness of the donor substrate.

6. The method of claim 4, wherein the donor substrate is detached along the weakened zone by at least one of chemical etching or mechano-chemical etching.

7. The method of claim 1, wherein the vitreous layer is of an electrically insulating material.

8. The method of claim 1, wherein the vitreous layer comprises silicon oxide.

9. The method of claim 1, wherein the donor substrate comprises silicon, the buffer layer comprises silicon-germanium, and the strained layer is made of silicon or a $Si_{1-x}Ge_x$ material.

10. The method of claim 1, wherein the viscosity temperature of the vitreous layer is greater than about 900° C. and the heat treating occurs at a temparature above about 900° C. to about 1500° C.

11. The method of claim 1, wherein the buffer layer comprises a relaxed silicon-germanium layer, and the at least one strained layer is grown on the relaxed silicon-germanium layer.

12. A method for forming a relaxed or pseudo-relaxed useful layer on a substrate which comprises:

growing at least one strained semiconductor layer on a donor substrate that includes a buffer layer, with the strained semiconductor layer grown on the buffer layer;

bonding a receiver substrate to the strained semiconductor layer by a vitreous layer of a material that becomes viscous above a certain viscosity temperature to form a first structure;

detaching the donor substrate from the first structure to form a second structure comprising the receiver substrate, the vitreous layer, and the strained layer; and heat treating the second structure at a temperature and time sufficient to relax strains in one or more of the layers of the strained semiconductor layer to form a relaxed or pseudo-relaxed useful layer on the receiver substrate, wherein the buffer layer includes a first layer of silicon-germanium of variable composition and a second layer of silicongermanium of constant composition.

13. The method of claim 12, wherein the donor substrate comprises a bulk structure of single crystal silicon, the first layer has a silicon content that varies from 100% adjacent the donor substrate to 0% adjacent the second layer.

14. The method of claim 13, wherein the buffer layer is formed by stacking layers of different composition on the donor substrate.

15. The method of claim 12, wherein the second layer of the buffer layer comprises a relaxed silicon-germanium layer, and the at Least one strained layer is grown on the relaxed silicon-germanium layer.

16. The method of claim 15, wherein the at least one strained layer includes a first layer of strained silicon and a second layer of strained silicon-germanium.

17. The method of claim 1, wherein the vitreous layer is formed on the strained layer or the receiver substrate at a thickness of about between 5 Å and about 5000 Å prior to bonding.

18. A method for forming a relaxed or pseudo-relaxed useful layer on a substrate which comprises:

growing at least one strained semiconductor layer on a donor substrate that includes a buffer layer, with the strained semiconductor layer grown on the buffer layer;

bonding a receiver substrate to the strained semiconductor layer by a vitreous layer of a material that becomes viscous above a certain viscosity temperature to form a first structure;

detaching the donor substrate and buffer layer from the first structure to form a second structure comprising the receiver substrate, the vitreous layer, and the strained layer; and heat treating the second structure at a temperature and time sufficient to relax strains in one or more of the layers of the strained semiconductor layer to form a relaxed or pseudo-relaxed useful layer on the receiver substrate, wherein the vitreous layer is provided by growing a semiconductor material layer on the strained layer and applying a controlled treatment to convert at least part of the semiconductor material layer into a material which is viscous above the certain viscosity temperature.

19. The method of claim 18, wherein the semiconductor material layer comprises silicon, and the controlled treatment is a controlled thermal oxidation treatment that converts at least part of the silicon layer into a silicon oxide vitreous layer.

20. The method of claim 18, wherein the controlled treatment forms an inserted layer between the vitreous layer and the strained layer, and the inserted layer becomes at least a partially strained layer after the heat treatment.

21. A method for forming a relaxed or pseudo-relaxed useful layer on a substrate which compnses:

growing at least one strained semiconductor layer on a donor substrate that includes a buffer layer, with the strained semiconductor layer grown on the buffer layer;

bonding a receiver substrate to the strained semiconductor layer by a vitreous layer of a material that becomes viscous above a certain viscosity temperature to form a first structure;

detaching the donor substrate and buffer layer from the first structure to form a second structure comprising the receiver substrate, the vitreous layer, and the strained layer; and heat treating the second structure at a temperature and time sufficient to relax strains in one or more of the layers of the strained semiconductor layer to form a relaxed or pseudo-relaxed useful layer on the receiver substrate, and applying a bonding layer of silicon oxide onto at least one of the vitreous layer, the receiver substrate or the strained layer prior to the bonding step.

22. The method of claim 4, wherein the zone of weakness is formed by implanting atomic species in one of the strained layers.

23. A method for forming a relaxed or pseudo-relaxed useful layer on a substrate which comprises:
   growing at least one strained semiconductor layer on a donor substrate that includes a buffer layer, with the strained semiconductor layer grown on the buffer layer;
   bonding a receiver substrate to the strained semiconductor layer by a vitreous layer of a material that becomes viscous above a certain viscosity temperature to form a first structure;
   detaching the donor substrate and buffer layer from the first structure to form a second structure comprising the receiver substrate, the vitreous layer, and the strained layer; and heat treating the second structure at a temperature and time sufficient to relax strains in one or more of the layers of the strained semiconductor layer to form a relaxed or pseudo-relaxed useful layer on the receiver substrate, wherein the donor substrate is detached along the zone of weakness to form a third structure comprising the receiver substrate, the vitreous layer, the strained layer(s), the buffer layer and a layer of donor material, and wherein the layer of donor material is removed before heat treating the third structure.

24. A method for forming a relaxed or pseudo-relaxed useful layer on a substrate which comprises:
   growing at least one strained semiconductor layer on a donor substrate that includes a buffer layer, with the strained semiconductor layer grown on the buffer layer;
   bonding a receiver substrate to the strained semiconductor layer by a vitreous layer of a material that becomes viscous above a certain viscosity temperature to form a first structure;
   detaching the donor substrate and buffer layer from the first structure to form a second structure comprising the receiver substrate, the vitreous layer, and the strained layer; and heat treating the second structure at a temperature and time sufficient to relax strains in one or more of the layers of the strained semiconductor layer to form a relaxed or pseudo-relaxed useful layer on the receiver substrate, wherein the buffer layer includes a first layer of variable composition and a second layer of constant composition.

25. The method of claim 24, wherein the first and second layers of the buffer layer are of Type III-V or II-VI semiconductor materials.

26. A method for forming a relaxed or pseudo-relaxed useful layer on a substrate which comprises:
   growing at least one strained semiconductor layer on a donor substrate that includes a buffer layer, with the strained semiconductor layer grown on the buffer layer;
   bonding a receiver substrate to the strained semiconductor layer by a vitreous layer of a material that becomes viscous above a certain viscosity temperature to form a first structure;
   detaching the donor substrate and buffer layer from the first structure to form a second structure comprising the receiver substrate, the vitreous layer, and the strained layer; and heat treating the second structure at a temperature and time sufficient to relax strains in one or more of the layers of the strained semiconductor layer to form a relaxed or pseudo-relaxed useful layer on the receiver substrate, wherein the growing of at least one strained semiconductor layer on a donor substrate includes growing of a first layer of strained silicon and growing of a second layer of strained silicon-germanium.

* * * * *

UNITED STATES PATENT AND TRADEMARK OFFICE
CERTIFICATE OF CORRECTION

PATENT NO. : 7,348,260 B2
APPLICATION NO. : 11/181414
DATED : March 25, 2008
INVENTOR(S) : Ghyselen It is certified that error appears in the above-identified patent and that said Letters Patent is hereby corrected as shown below:

Column 13:
Line 37 (claim 10, line 3), change "temparature" to -- temperature --.
Line 62 (claim 12, line 19), change "silicongermanium" to -- silicon-germanium --.

Column 14:
Line 6 (claim 15, line 3), change "Least" to -- least --.
Line 48 (claim 21, line 2), change "compnses" to -- comprises --.

Signed and Sealed this

Twenty-fourth Day of June, 2008

JON W. DUDAS
*Director of the United States Patent and Trademark Office*